(12) United States Patent
Roy et al.

(10) Patent No.: US 12,516,410 B2
(45) Date of Patent: Jan. 6, 2026

(54) DIELECTRIC FILLED NANOSTRUCTURED SILICA SUBSTRATE FOR FLAT OPTICAL DEVICES

(71) Applicant: Applied Materials, Inc., Santa Clara, CA (US)

(72) Inventors: Tapashree Roy, Bangalore (IN); Rutger Meyer Timmerman Thijssen, Sunnyvale, CA (US); Ludovic Godet, Sunnyvale, CA (US); Jinxin Fu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 17/963,983

(22) Filed: Oct. 11, 2022

(65) Prior Publication Data

US 2023/0033741 A1    Feb. 2, 2023

Related U.S. Application Data

(62) Division of application No. 16/395,005, filed on Apr. 25, 2019, now Pat. No. 11,473,191.

(30) Foreign Application Priority Data

Feb. 27, 2019   (IN) .............. 201941007558

(51) Int. Cl.
| | | |
|---|---|---|
| *G02B 6/12* | (2006.01) | |
| *C03C 17/34* | (2006.01) | |
| *C23C 16/02* | (2006.01) | |
| *C23C 16/04* | (2006.01) | |
| *C23C 16/40* | (2006.01) | |

(52) U.S. Cl.
CPC ...... *C23C 16/0227* (2013.01); *C03C 17/3429* (2013.01); *C23C 16/045* (2013.01); *C23C 16/405* (2013.01)

(58) Field of Classification Search
CPC .... G02B 2006/121; G02B 2006/12173; G02B 2006/12176; G02B 2006/12188; G02B 6/122; G02B 6/132; G02B 1/002; B82Y 20/00
See application file for complete search history.

(56) References Cited

U.S. PATENT DOCUMENTS

| | | |
|---|---|---|
| 6,130,454 A | 10/2000 | Gardner et al. |
| 6,140,652 A | 10/2000 | Shlepr et al. |
| 6,214,697 B1 | 4/2001 | Moore et al. |

(Continued)

FOREIGN PATENT DOCUMENTS

WO    2018-136972 A1    7/2018

OTHER PUBLICATIONS

European Search Report in related Application No. 20763703.4 dated Mar. 30, 2023.

(Continued)

*Primary Examiner* — Maria V Ewald
*Assistant Examiner* — Daniel P Dillon
(74) *Attorney, Agent, or Firm* — Patterson + Sheridan, LLP

(57) ABSTRACT

A method and apparatus for creating a flat optical structure is disclosed. The method includes etching at least one trench in a substrate, placing a dielectric material in at least one trench in the substrate and encapsulating the top of the substrate with a film.

19 Claims, 7 Drawing Sheets

(56) References Cited

U.S. PATENT DOCUMENTS

| | | | |
|---|---|---|---|
| 6,404,942 B1 | 6/2002 | Edwards et al. | |
| 6,649,489 B1 | 11/2003 | Chang et al. | |
| 6,686,293 B2 | 2/2004 | Kim et al. | |
| 6,919,259 B2 | 7/2005 | Chang et al. | |
| 6,949,460 B2 | 9/2005 | Wagganer et al. | |
| 7,132,134 B2 | 11/2006 | Rossman | |
| 8,153,502 B2* | 4/2012 | Li | H01L 21/76224 |
| | | | 257/E21.546 |
| 8,815,704 B2 | 8/2014 | Meade et al. | |
| 8,867,879 B2 | 10/2014 | Bigot-Astruc et al. | |
| 9,236,328 B1 | 1/2016 | Leobandung | |
| 9,795,718 B1 | 10/2017 | Cao et al. | |
| 9,799,702 B2 | 10/2017 | Cheng et al. | |
| 10,782,468 B2 | 9/2020 | Ayi-Yovo et al. | |
| 2001/0024556 A1 | 9/2001 | Beguin et al. | |
| 2003/0033975 A1* | 2/2003 | Bazylenko | G02B 6/122 |
| | | | 117/84 |
| 2003/0049865 A1 | 3/2003 | Santini et al. | |
| 2005/0130400 A1 | 6/2005 | Grupp et al. | |
| 2006/0113598 A1 | 6/2006 | Chen et al. | |
| 2006/0157854 A1 | 7/2006 | Takewaki et al. | |
| 2006/0177178 A1 | 8/2006 | Greiner et al. | |
| 2008/0286660 A1 | 11/2008 | Petrarca et al. | |
| 2009/0121371 A1 | 5/2009 | Kawasaki | |
| 2010/0123386 A1 | 5/2010 | Chen | |
| 2013/0028564 A1 | 1/2013 | Molin et al. | |
| 2013/0128336 A1 | 5/2013 | Dean et al. | |
| 2013/0234698 A1 | 9/2013 | Dorner et al. | |
| 2013/0309870 A1 | 11/2013 | Hong et al. | |
| 2015/0212346 A1 | 7/2015 | Zheng et al. | |
| 2015/0277036 A1 | 10/2015 | Jiang et al. | |
| 2015/0304051 A1 | 10/2015 | Yuan et al. | |
| 2016/0084761 A1 | 3/2016 | Rothberg et al. | |
| 2016/0197111 A1 | 7/2016 | Coolbaugh et al. | |
| 2016/0291405 A1 | 10/2016 | Frisken et al. | |
| 2016/0351135 A1 | 12/2016 | Sampsell et al. | |
| 2017/0137943 A1 | 5/2017 | Mohn et al. | |
| 2018/0224574 A1* | 8/2018 | Lee | G02B 1/002 |
| 2018/0341090 A1 | 11/2018 | Devlin et al. | |
| 2018/0348548 A1 | 12/2018 | Visser et al. | |
| 2019/0033683 A1 | 1/2019 | Ahmed et al. | |
| 2019/0044003 A1 | 2/2019 | Heck et al. | |
| 2019/0181164 A1* | 6/2019 | Chen | H01L 27/14629 |
| 2019/0181181 A1 | 6/2019 | Yeon et al. | |
| 2020/0270746 A1 | 8/2020 | Roy et al. | |
| 2021/0183915 A1 | 6/2021 | Summerfelt et al. | |

OTHER PUBLICATIONS

International Search Report and Written Opinion dated Jun. 5, 2020 for Application No. PCT/US2020/017383.**.

Taiwan Office Action dated Feb. 3, 2021 for Application No. 109104298.**.

Banzhaf, S., et al., "Post-trench processing of silicon deep trench capacitors for power electronic applications," 2016 28th International Symposium on Power Semiconductor Devices and ICs (ISPSD), 2016, pp. 399-402, doi: 10.1109/ISPSD.2016.7520862.**.

Belyansky, M., et al., "Study of silicon strain in shallow trench isolation". J. Vac. Sci. Technol. A 28(4), Jul./Aug. 2010, pp. 829-833.**.

Chapman, Gemma, et al., "Focused electron beam deposited silicon dioxide derivatives for nano-electronic applications". Materials Science in Semiconductor Processing 147 (2022) 106736, pp. 1-6.**.

Chen, Yunhan, et al., "Robust Method of Fabricating Epitaxially Encapsulated MEMS Devices with Large Gaps". Journal of Microelectromechanical Systems, vol. 26, No. 6, Dec. 2017, p. 1235-1243.**.

Darnon, Maxime, et al., "Patterning of narrow porous SiOCH trenches using a TiN hard mask". Microelectronic Engineering, Elsevier, 2008, 85 (11), pp. 2226-2235. ff10.1016/j.mee.2008.06.025ff. ffhal-00387506f.**.

Gerung, Henry, et al., "In situ real-time monitoring of profile evolution during plasma etching of mesoporous low-dielectric-constant SiO2". J. Vac. Sci. Technol. A 23 (2), Mar./Apr. 2005, pp. 347-354.**.

Hadi, Mohammed, et al., "Preparation of high transmittance TiO2 thin films by sol-gel technique as antireflection coating", IOP Conf. Series: 2018 J. Phys.: Conf. Ser. 1032 012018, pp. 1-11.**.

Kim, Sejeong, et al., "Photonic crystal cavities from hexagonal boron nitride". Nature Communications, (2018) 9:2623, pp. 1-8.**.

Laermer, F., et al., "Bosch Deep Silicon Etching: Improving Uniformity and Etch Rate for Advanced MEMS Applications". Proceedings of the IEEE Micro Electro Mechanical Systems (MEMS), 1999, pp. 211-216. 10.1109/ MEMSYS.1999.746812.**.

Patterson, Oliver D., et al., "Methodology for Trench Capacitor Etch Optimization using Voltage Contrast Inspection and Special Processing". 2010 IEEE/SEMI Advanced Semiconductor Manufacturing Conference (ASMC), 2010, pp. 109-114, doi: 10.1109/ASMC.2010.5551433.**.

Shin, Young Jae, et al., "Fabrication and Encapsulation of a Short-Period Wire Grid Polarizer with Improved Viewing Angle by the Angled-Evaporation Method". Advanced Optical Materials, 2013, 1, 863-868.**.

Shkondin, E., et al., "High aspect ratio titanium nitride trench structures as plasmonic biosensor". Optical Materials Express 4171, vol. 7, No. 11, Nov. 1, 2017, 12 pages.**.

Zhao, Qiancheng, et al., "Optical properties of V-groove silicon nitride trench waveguides". Journal of the Optical Society of America A, vol. 33, No. 9, Sep. 2016, pp. 1851-1859.**.

Vengurlekar, Arvind S., "Optical properties of metallo-dielectric deep trench gratings: role of surface plasmons and Wood—Rayleigh anomaly". Optics Letters, vol. 33, No. 15, Aug. 1, 2008, pp. 1669-1671.**.

JP Office Action for Japanese Application No. 2021-549253 dated Sep. 19, 2023.

2018-136972, WO.

Zhao, Qiancheng, et al., "Optical properties of V-groove silicon nitride trench waveguides". Journal of the Optical Society of America A, vol. 33, No. 9, Sep. 2016, p. 1851-1859.

Japanese Office Action dated Apr. 9, 2024, for Japanese Patent Application No. 2021-549253.

Korean Office Action dated Mar. 25, 2024, for Korean Patent Application No. 10-2021-7030533.

Japanese Notice of Allowance dated May 7, 2025, for Japanese Patent Application No. 2021-549253.

Office Action in related applicaiton CN202080015721.3 dated Nov. 14, 2024.

Office Action in related application KR 10-2021-7030533 dated Nov. 11, 2024.

Office Action in related application JP 2021-549253 dated Oct. 31, 2024.

Search Report from Office Action dtd Apr. 22, 2025 for Chinese Patent Application No. 202080015721.3.

Office Action in related application CN 202080015721.3 dated Oct. 24, 2025.

* cited by examiner

| Wavelength (nm) | Dielectric | Substrate | Cross-Section | Polarity | Encapsulation | h (nm) | Pitch d+g (nm) | Min side (nm) | Max side (nm) | Min g (nm) |
|---|---|---|---|---|---|---|---|---|---|---|
| 632 | TiO2 | SiO2 | Square | Positive | None | 600 | 290 | 70 | 240 | 55 |
| 632 | TiO2 | SiO2 | Square | Positive | None | 850 | 290 | 70 | 190 | 100 |

DIELECTRIC FILLED NANOSTRUCTURED SILICA SUBSTRATE FOR FLAT OPTICAL DEVICES

CROSS-REFERENCE TO RELATED APPLICATIONS

This application is a divisional of, and claims benefit from, U.S. patent application Ser. No. 16/395,005, filed Apr. 25, 2019, which is incorporated by reference herein in its entirety. Application Ser. No. 16/395,005 claims benefit of Indian Patent Application No. 201941007558, filed on Feb. 27, 2019, which is incorporated by reference herein in its entirety.

BACKGROUND

Field

Embodiments of the present disclosure generally relate to optical devices. More specifically, aspects of the disclosure relate to a dielectric filled nanostructured silica substrate for flat optical devices.

Description of the Related Art

For flat optical devices, dielectric films are structured with features that are smaller than the wavelength of operation. For visible and near IR spectrum, for example, the smallest features of nanostructures often become as small as 30 nanometers which is beyond most of the lithography methods available for large scale device fabrication.

Flat optical devices are often subjected to harsh conditions during service. Conventional flat optical designs have structures that limit their use as the designs may not be rugged enough for service conditions. There is a need to provide a flat optical device that can withstand increasingly harsh service conditions.

Another drawback to conventional methods of manufacture and apparatus is that conventional methods of manufacture are limited in the size of features produced as the lithography methods available are limited.

There is a need to provide a method and apparatus for producing flat optical devices that are fit for their intended purposes.

There is a further need to provide a method for producing flat optical devices that is economical for large scale fabrication.

There is a further need to provide a method for producing flat optical devices that may incorporate nanostructures that are of a small scale.

SUMMARY

Aspects of the summary are presented for illustrative purposes only and are not meant to limit the scope of the claims or the disclosure.

In one non-limiting embodiment, a method for creating a flat optical structure is disclosed, comprising providing a substrate, etching at least one nanotrench in the substrate, placing a dielectric material in the at least one nanotrench in the substrate and encapsulating a top of the substrate with a film.

In another example embodiment, a method for creating a flat optical structure is disclosed comprising: providing a substrate, depositing a material on to a first face of the substrate, etching at least one nanotrench in the material deposited on the first face of the substrate and encapsulating a top of the material deposited on the first face of the substrate with an encapsulating material.

In another example embodiment, a method for creating a flat optical structure is disclosed comprising: providing a substrate, depositing a material on to a first face of the substrate, etching at least one trench in the material deposited on the first face of the substrate, and encapsulating a top of the material deposited on the first face of the substrate with an encapsulating material.

In another example embodiment, a method for creating a flat optical structure is disclosed comprising: providing a silicon dioxide substrate with at least one flat surface; etching at least one trench in the at least one flat surface of the silicon dioxide substrate; placing a dielectric material in the at least one trench in the at least one flat surface of the silicon dioxide substrate and encapsulating the placed dielectric material in the at least one trench in the at least one flat surface of the silicon dioxide substrate with a film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1C:
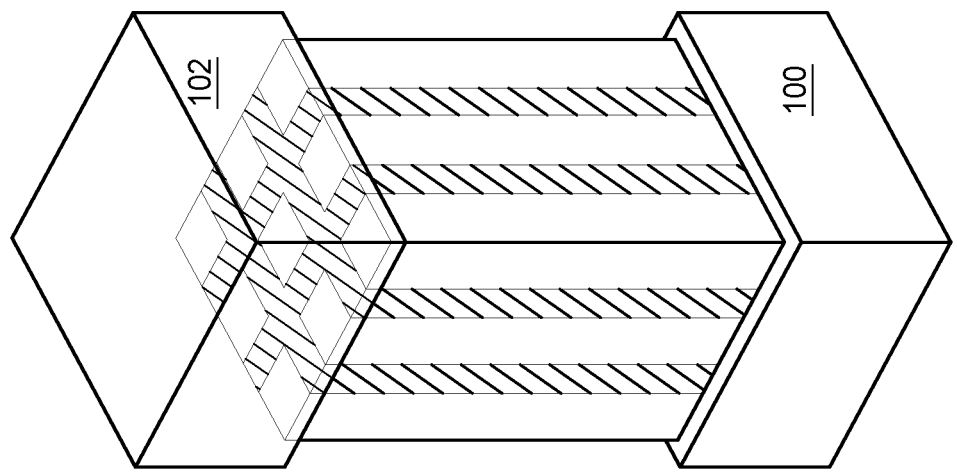
FIGS. 1A, 1B, and 1C disclose a top view, side view and perspective view of dielectric nanotrenches in one non-limiting example embodiment of the aspects described.

In the example embodiments described below, arrangements and methods are disclosed to provide for production for flat optical devices. In embodiments described, different methods and materials are used, compared to conventional methods and materials to produce the flat optical devices. The methods and apparatus provided allow for superior manufacturing of flat optical devices that are more fit compared to their conventionally made counterparts. Aspects of the apparatus provide for use of different materials, such as silicon dioxide ($SiO_2$) that has a low refractive index (RI) and k value. Other components of the apparatus use titanium dioxide ($TiO_2$) that has a higher refractive index and low k value. The functional materials may be referred to as a "dielectric" which has a high refractive index (RI) and low k and different than the substrate, inter-structure spaces and encapsulants. In the embodiments illustrated and described, the terms trenches and pillars are used. The lateral dimensions of the trenches and pillars are on the order of half of a wavelength of operation.

In embodiments, instead of using pillars, aspects of the disclosure seek to use trenches in dielectric materials to achieve a similar result. In manufacturing, some embodiments are more cost effective to establish using trenching technologies than to establish using pillars.

To increase the durability of the entire design, some arrangements are subjected to placement of an encapsulant. The encapsulant may cover one section of an arrangement and provide for not only the dielectric properties required, but also wear capabilities to make the resulting configurations more fit for intended purposes.

In some non-limiting aspects, silicon dioxide materials are used as device encapsulants, producing faster, cheaper and overall superior operating devices. In embodiments, a structured silicon dioxide film is used in conjunction with a silicon dioxide substrate that has desired nanostructures. The nanostructures may be pillars or holes and have different cross sections, such as square, circle, ellipse or arbitrary shape. A lattice may also be configured with square, hexagonal or arbitrary positions. Gaps in the created nanostructures may be filled, as desired. The gaps may be filled with spin-on dielectric materials (titanium dioxide, SiN, ZnO, etc.) or materials that may be used with chemical vapor deposition that are flowable.

In alternative nanostructure design, holes or trenches may be placed in a dielectric film compared to established dielectric nanopillars. In one non-limiting embodiment, flat optical devices may be made, starting with a silica substrate and then depositing a dielectric thin film over the structured silica substrate and any gap filling materials. In embodiments, the gaps in the arrangements created are filled and then encapsulated. In one example embodiment, a silica substrate is created such that the silica substrate is structured with a profile. This profile is then filled by using a spin-on dielectric in order to easily and cost effectively fill in the structured substrate to build nanostructures. In embodiments, trenches (holes) in a dielectric film may occur, in place of pillars, delivering comparable optical performance to pillar construction embodiments.

In the embodiments disclosed, making trenches on a dielectric film or in a substrate is a superior process compared to conventional methods of making isolated pillars on a dielectric film. Nanotrenches may be used with a structured silica method or a method of depositing a dielectric film on a planar silica substrate and nanostructuring the result.

Figure 1B:
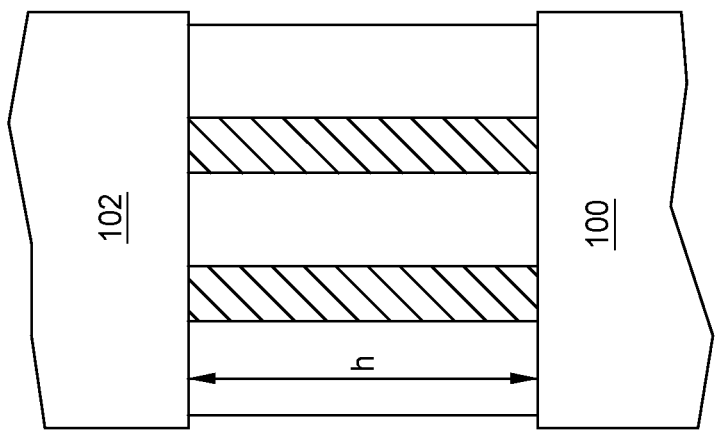
Figure 1A:
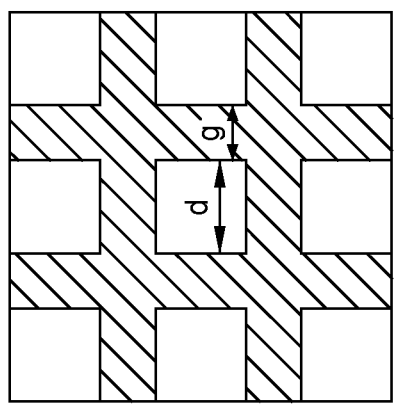

Referring to FIG. 1A, a top view of a dielectric nanotrench is illustrated. In the illustrated embodiment, the values d and g are such that these values are less than one measured wavelength. In the top view of the dielectric nanotrench, the structure measured by value g is a $TiO_2$ as a non-limiting embodiment. A high RI value may be used with a low absorption dielectric (e.g., $TiO_2$, GaP, aSi, cSi, SiN, etc.) for value g. The structure designated by distance d is $SiO_2$ which has a low RI and is a low absorption dielectric. The height of the trench created "h", in FIG. 1B, may be variable as the distance between the substrate 100 and the encapsulant 102 may vary. A perspective view, 1C, is presented indicating the layers of $SiO_2$ and $TiO_2$. For further clarification, the titanium dioxide $TiO_2$ is formed in a hashtag or pound shape (i.e., "#") with silicon dioxide forming the remainder of the substrate, encapsulant and the spaces between the constituent flanges of the shape.

Figure 2C:
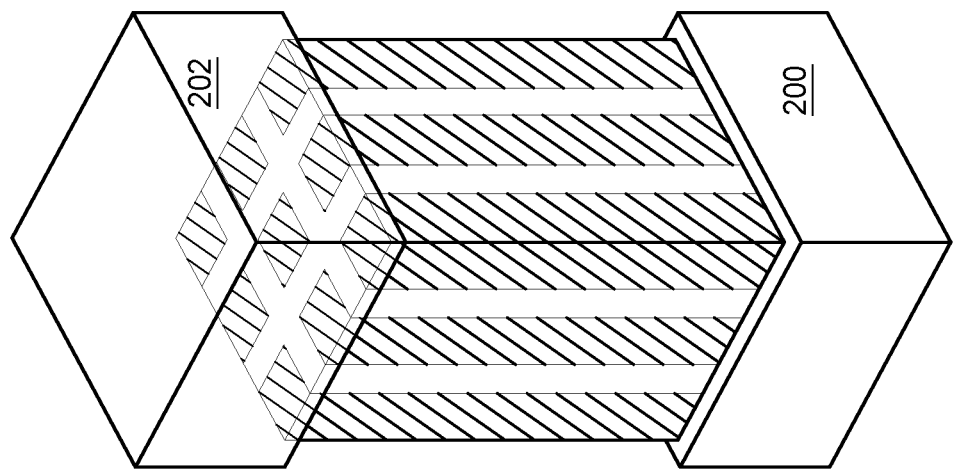
FIGS. 2A, 2B and 2C disclose a top view, side view and perspective view of dielectric nanopillars with an encapsulant and substrate.
Figure 2B:
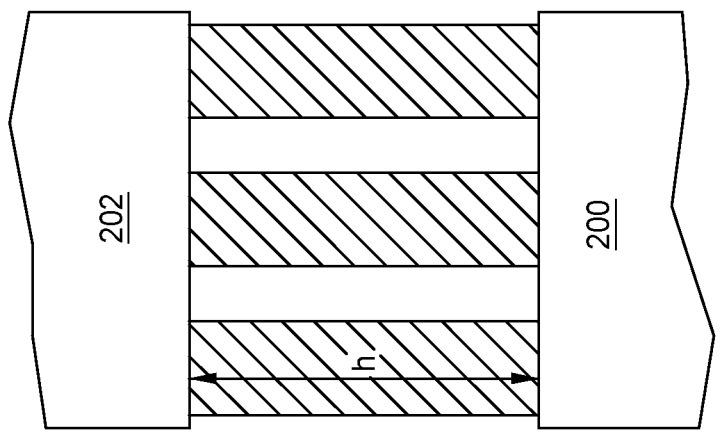
Figure 2A:
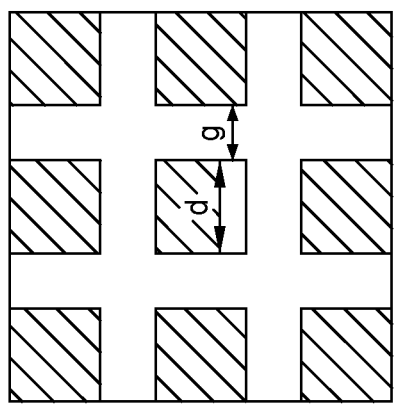

Referring to FIG. 2A, a top view of a dielectric nanopillar arrangement is illustrated. In the illustrated embodiment, the values d and g are such that these values are less than one measured wavelength. In the top view of the dielectric nanopillar, the structure measured by value g is a $SiO_2$ as a non-limiting embodiment. The value of d measures a part of the nanopillar structure that is made of $TiO_2$. A high RI value may be used with a low absorption dielectric for example ($TiO_2$, GaP, aSi, cSi, SiN, etc.). The height of the trench created "h" may be variable as the distance between the substrate 200 and the encapsulant 202 may vary. A perspective view, 2C, is presented indicating the layers of $SiO_2$ and $TiO_2$.

Figure 3A:
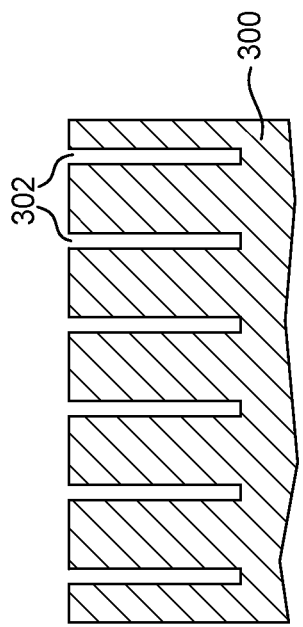
FIGS. 3A, 3B and 3C disclose a proposed ideal method of etching, filling and encapsulating an arrangement in one non-limiting example embodiment of the aspects described.
Figure 3B:
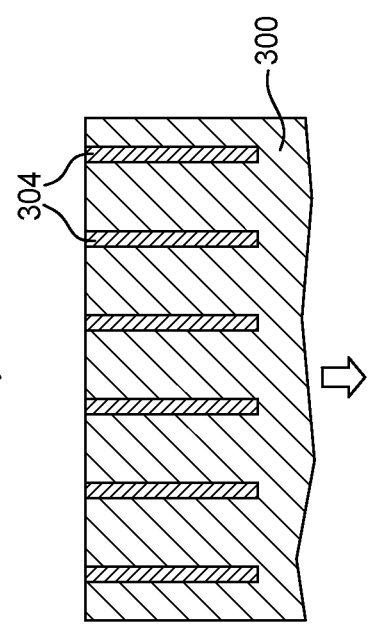
Figure 3C:
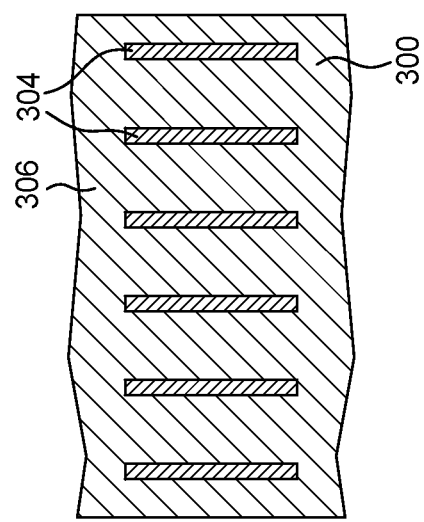

Referring to FIGS. 3A, 3B and 3C, a process flow is illustrated for a nanopillar or nanotrench design. In FIG. 3A, a substrate 300 is provided where etched pillars/trenches 302 are provided. In FIG. 3B, a spin on high RI, low k dielectric is used to fill the pillars/trenches 302. Progressing further in time, in FIG. 3C, the arrangement from FIG. 3B is encapsulated with $SiO_2$ indicating the ideal configuration.

Figure 4A:
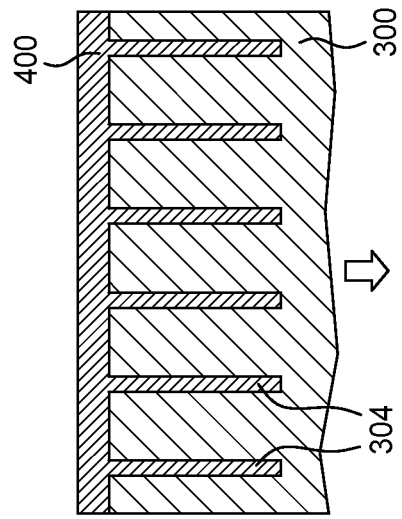
FIGS. 4A and 4B are actual results of the ideal method of etching filling and encapsulating the arrangement of FIG. 3.
Figure 4B:
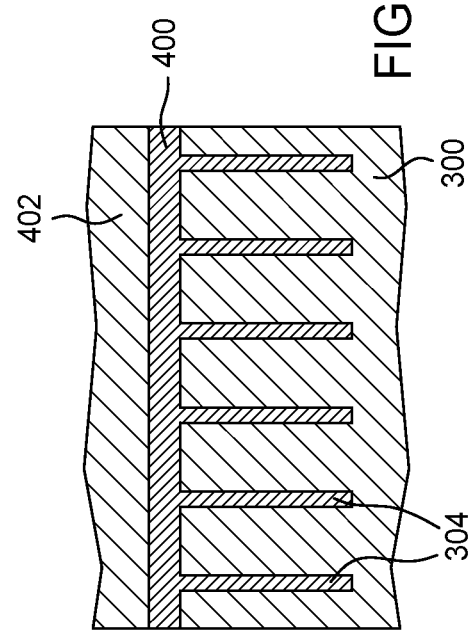

Referring to FIGS. 4A and 4B, the as-constructed arrangement resulting from FIG. 3 is presented. While FIGS. 3A, 3B and 3C, illustrate the ideal construction resulting from the methodology described, FIGS. 4A and 4B present that the filling of the trenches, in FIG. 3B, actually occur such that the trenches are filled over the top, with a top layer of overfilled dielectric layer 400 present. Then, the encapsulate 402 is placed over the dielectric layer 400 to construct the final arrangement.

Figure 5A:
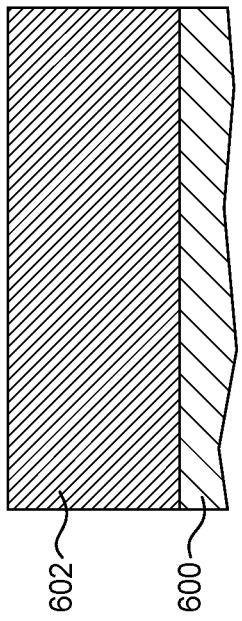
FIGS. 5A, 5B and 5C illustrate a process flow for nanotrench creation, filling and processing in accordance with another non-limiting example embodiment of an aspect described.
Figure 5B:
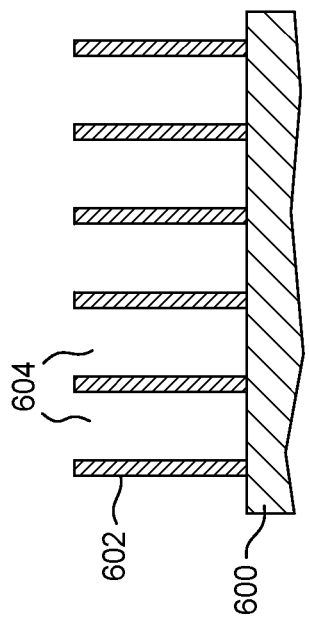
Figure 5C:
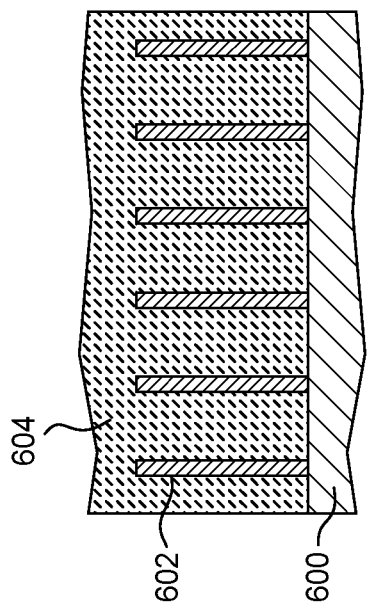

Referring to FIGS. 5A, 5B and 5C, a second process flow is illustrated in another embodiment. In FIG. 5A, $SiO_2$ pillars are etched on a $SiO_2$ substrate. In FIG. 5B, the nanotrenches etched in the $SiO_2$ are filled with spin-on high n, low k dielectric material. In FIG. 5C, the resulting arrangement from 5B are encapsulated with a low RI, low k material.

Figure 6A:
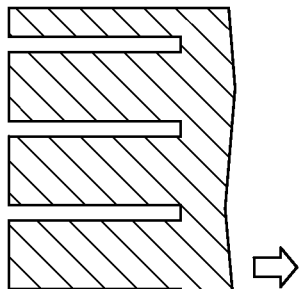
FIGS. 6A, 6B and 6C illustrate a second process flow for nanotrench creation, filling and processing in accordance with another non-limiting example embodiment of an aspect described.
Figure 6B:
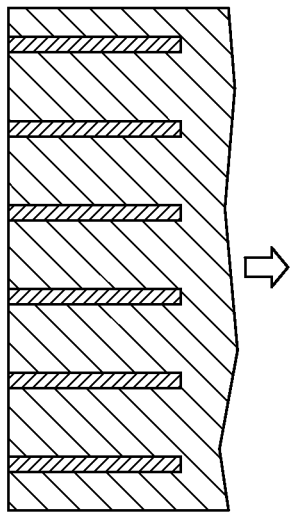
Figure 6C:
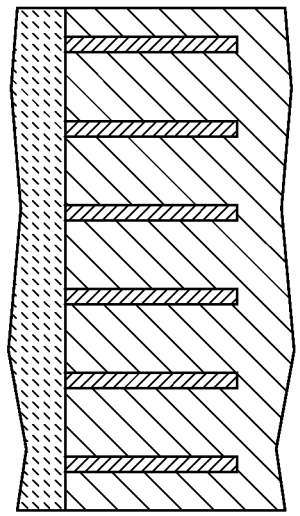

Referring to FIGS. 6A, 6B and 6C, an alternate process flow to that described in FIGS. 5A, 5B and 5C is illustrated. In FIG. 6A, a $SiO_2$ substrate 600 is provided and a high RI, low k dielectric 602 is placed on the substrate 600 surface, such as $SiO_2$. In FIG. 6B, nanotrenches 604 are placed in the high RI, low k dielectric layer 602. Proceeding to FIG. 6C, the trenches are filled with a low RI, low k material to provide a completed arrangement.

As the "as constructed" embodiments may differ from ideal designs, different variations of the embodiments described above were tested for compliance to ensure that such "as constructed" embodiments satisfy design goals. As the illustrated embodiments use trenches rather than pillar arrangements, a test was conducted to determine if the two types of arrangements (pillars and trenches) provide similar results in testing.

Figure 7:
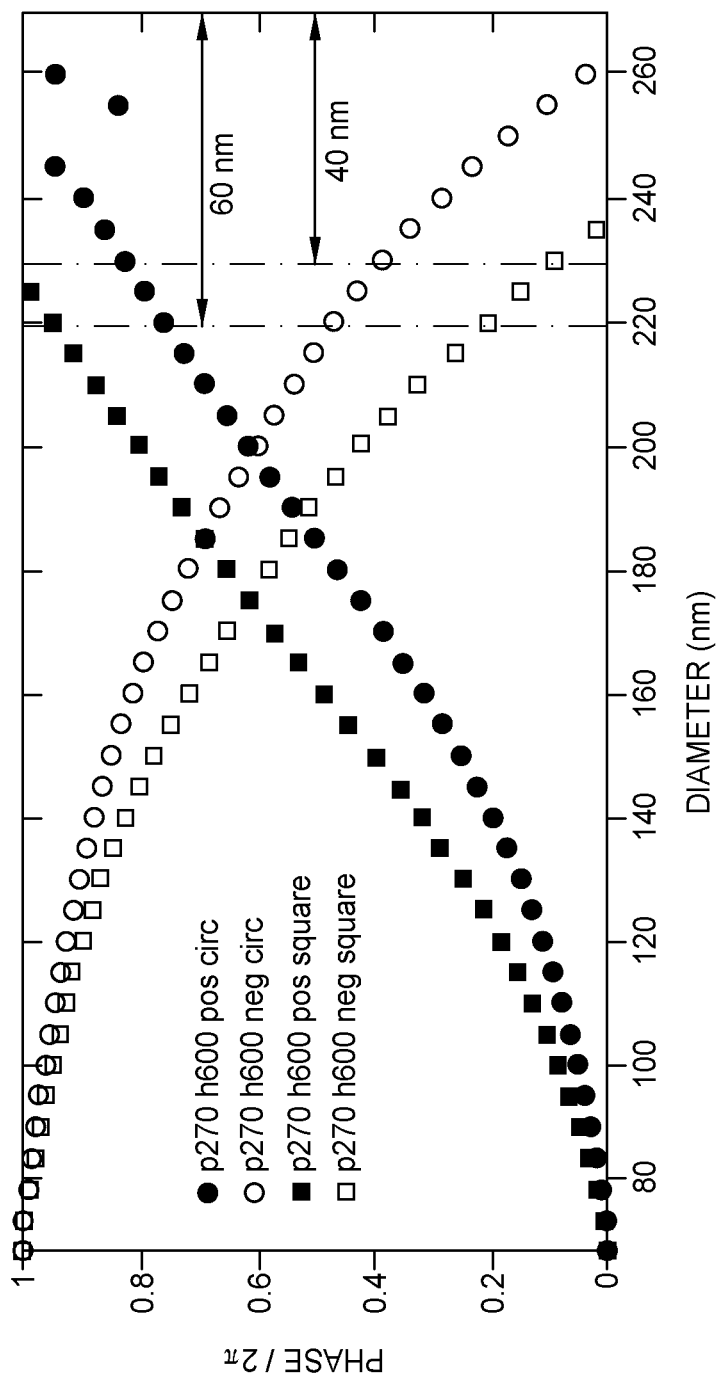
FIG. 7 is a graph of phase change of pillar and trench arrangement diameters in a dielectric film verses diameter measurement for positive and negative circle and square configurations.

Referring to FIG. 7, a graph of phase change vs. diameter is illustrated. In the illustrated graph solid circle designate a pillar with circular cross section. A hollow circle provides a trench with circular cross section. A solid square designates a pillar with square cross section. A hollow square designates a trench with square cross-section. In the illustrated graph, the transmission phase of both the circular and square pillars start from a value of 0 and increase to 1 over the life of the graph. In the trench configurations, the values of transmission phase start from 1 and decrease to 0 over the life of the graph. Thus, as can be seen from FIG. 8, phase change does occur for both positive and negative configurations. As the lateral dimensions of the nanopillar (trench) is varied monotonically, in one embodiment, is important to access all possible values of transmission phase (normalized) between 0 and 1. Simultaneously, the transmission amplitude should remain as close to 1 as possible, i.e., maximal, irrespective of the change in the sizes of the nanostructures.

Figure 8:
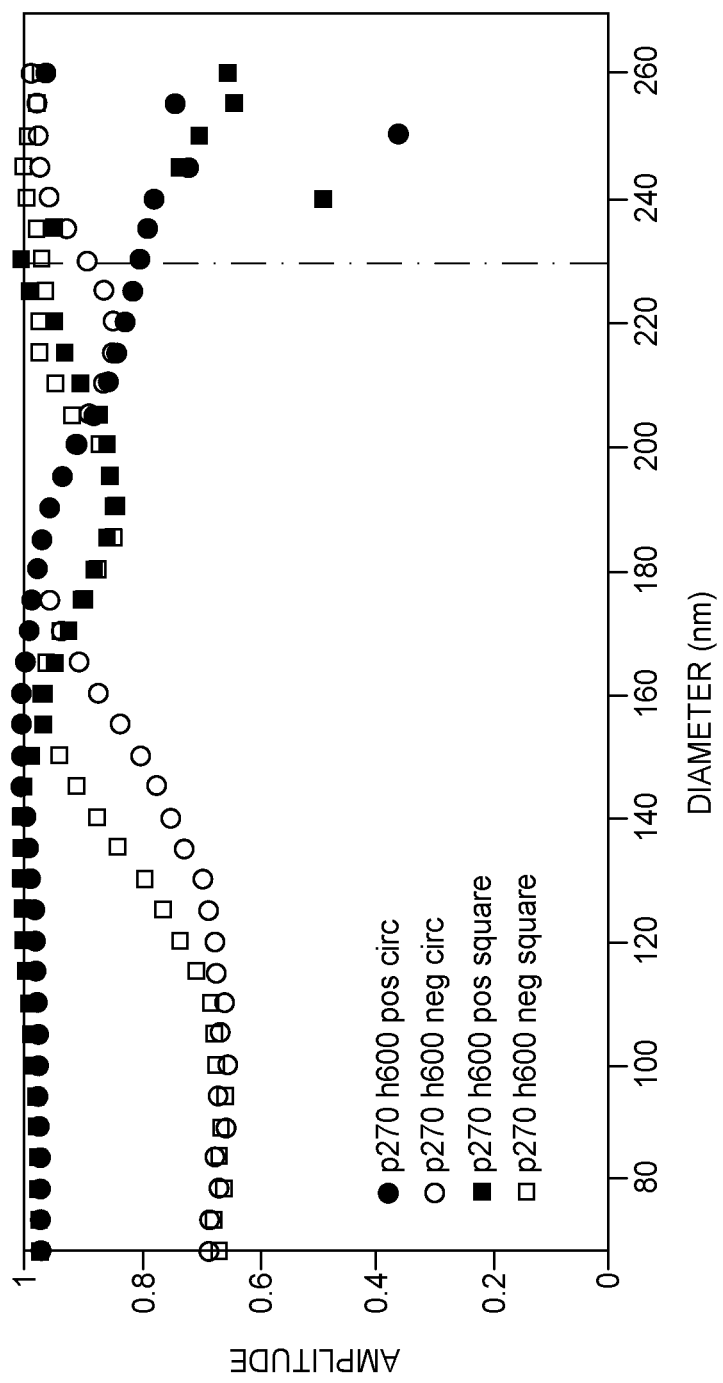
FIG. 8 is a graph of amplitude of pillar and trench arrangement diameters in a dielectric film verses diameter measurement for positive and negative circle and square configurations.

Referring to FIG. 8, a graph of amplitude vs diameter is illustrated. In the illustrated graph solid circle designate a positive circle configuration. A hollow circle provides a negative circle configuration. A solid square designates a positive square configuration. A hollow square designates a negative square configuration. As presented in FIG. 8, the positive circle and positive square configurations have an approximate value of 1 up till value 180 nm and then slowly decrease. The negative circle and negative square values have slightly lower amplitude of approximately 0.7 and then increasing to approximately a value of 1 for the remainder of the diameter values. In the embodiments shown, pillars transmit larger amplitudes than trenches.

Figures 9, 10:
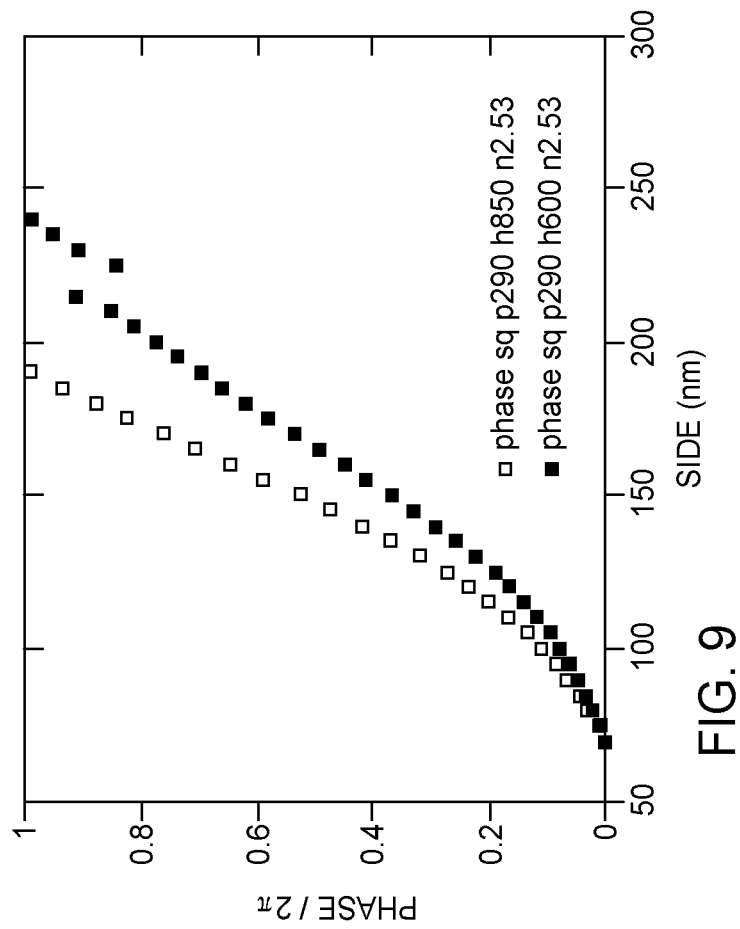
FIG. 9 is a graph of phase change vs. film thickness.
FIG. 10 is a chart of nanopillar height and minimum and maximum dimensions and spacings for pillar design.

Referring to FIG. 9, a graph of phase change vs square side dimension is illustrated. For both square pillar configurations, as the side measurement increases, the phase change increases. As illustrated, the taller the pillars for a specific configuration may be, the larger will be the minimum (closest) gap between two adjacent pillars. For increasing a film thickness from 600 nm to 850 nm, the overall transmission amplitude is increased as well as improving the minimum gap requirement from 40 nm to 600 nm. FIG. 10 presents features of wavelength, dielectric type and sizing in one non-limiting embodiment. In the embodiments shown, aspects of the disclose indicate that a square pillar shape is more desired than a square trench that is more desired than a circular pillar than is more desirable than a circular trench.

Through tests performed on various alterations of ideal and "as constructed" types of arrangements, testing indicates that rounding corners of square trenches can be compensated for by increasing a thickness of the dielectric film used in different embodiments. For embodiments where the "as constructed" arrangement has a residual top layer, minimal changes to phase change and amplitude of signal occur. Encapsulation material used for the top surface may impact the depth of trenches used. Lowering the refractive index of the encapsulation material, the lower the aspect ratio (h:d) and, hence, the more relaxed the fabrication constraints in terms of etching the nanostructures.

In the illustrated embodiments, from a manufacturing standpoint, square configurations are easier to produce than circle configurations, therefore squares are less expensive to produce than circles.

In the illustrated embodiments the arrangement described may have configurations that are smaller than 30 nanometers, thereby exceeding the resolution limit of conventional apparatus.

The flat optical devices are processed such that components are encapsulated. Such encapsulation allows for more durable devices that are more fit for intended purposes.

Aspects of the disclosure provide a method for producing flat optical devices that is economical for large scale fabrication.

In one example embodiment, a method for creating a flat optical structure is disclosed comprising: providing a substrate; etching at least one trench in the substrate; placing a dielectric material in the at least one trench in the substrate; and encapsulating a top of the substrate with a film.

In another example embodiment, the method is provided wherein the substrate is made of silicon dioxide.

In another example embodiment, the method is provided wherein the placing the dielectric material in the at least one trench in the substrate is through a spinning process.

In another example embodiment, the method is provided wherein the encapsulating the top of the substrate with the film is through use of a $SiO_2$ film.

In another example embodiment, the method is provided wherein the placing the dielectric material in the at least one trench in the substrate includes providing an overfill dielectric layer.

In another example embodiment, a method for creating a flat optical structure, comprising: providing a substrate, depositing a material on to a first face of the substrate, etching at least one trench in the material deposited on the first face of the substrate and encapsulating a top of the material deposited on the first face of the substrate with an encapsulating material.

In another example embodiment, the method may be performed wherein the substrate is made of $SiO_2$.

In another example embodiment, the method may be performed wherein the encapsulating material has a low refractive index and is a low k material.

In another example embodiment, an arrangement is disclosed, comprising a substrate with at least one trench, a spun material placed in the at least one nanotrench; and an encapsulating material placed in contact with the substrate and the spun material.

In another example embodiment, the spun material placed in the at least one trench further comprises an overfill layer.

In another example embodiment, the spun material placed in the at least one trench is titanium dioxide.

In another example embodiment, the substrate with the at least one trench is made of silicon dioxide.

In another example embodiment, the spun material is one of GaP, aSi, cSi and SiN.

In another example embodiment, a method for creating a flat optical structure is disclosed comprising: providing a silicon dioxide substrate with at least one flat surface; etching at least one trench in the at least one flat surface of the silicon dioxide substrate; placing a dielectric material in the at least one trench in the at least one flat surface of the silicon dioxide substrate and encapsulating the placed dielectric material in the at least one trench in the at least one flat surface of the silicon dioxide substrate with a film.

In another non-limiting embodiment, the method may be performed wherein the dielectric material is deposited through a spinning process.

In another non-limiting embodiment, the method may be performed wherein the material is GaP.

In another non-limiting embodiment, the method may be performed wherein the material is one of aSi and SiN.

While the foregoing is directed to embodiments of the present disclosure, other and further embodiments of the disclosure may be devised without departing from the basic scope thereof, and the scope thereof is determined by the claims that follow.

What is claimed is:

1. A flat optical structure, comprising:
    a substrate with a first trench spaced from a second trench;
    a dielectric material filling the first trench;
    an overfill layer of the dielectric material disposed over a top of the first and second trenches; and
    a film encapsulating the overfill layer, the film having a refractive index lower than a refractive index of the dielectric material;
    wherein lateral dimensions of the first and second trenches vary from a first magnitude to a second larger magnitude so that a normalized phase change of a selected light wavelength through the dielectric material is equal to one at the first magnitude of the lateral dimension and zero at the second magnitude of the lateral dimension.

2. The flat optical structure of claim 1, wherein a width of the first trench is a maximum of one half a wavelength of operation of the flat optical structure.

3. The flat optical structure of claim 2, wherein the substrate is made of silicon dioxide.

4. The flat optical structure of claim 2, wherein the film is a $SiO_2$ film.

5. The flat optical structure of claim 1, wherein:
    the substrate is made of a silicon dioxide; and
    the first and second trenches are etched into a flat surface of the substrate; and
    the film encapsulates the dielectric material in the first trench.

6. The flat optical structure of claim 5, wherein the dielectric material includes one of titanium dioxide, GaP, aSi, cSi, or $Si_3N_4$.

7. The flat optical structure of claim 6, wherein the film has a refractive index greater than 1.8 and an absorption coefficient less than 0.01.

8. The flat optical structure of claim 1, wherein:
    a material of the substrate is exposed at a bottom of the first trench; and
    the dielectric material fills the first trench from the bottom to a top of the first trench.

9. The flat optical structure of claim 1, wherein the first trench intersects the second trench.

10. A flat optical structure, comprising:
    a substrate of a first material having a first refractive index;
    a trench in the substrate, wherein the first material is exposed at a bottom of the trench;
    a second material filling the trench from the bottom to a top of the trench, the second material including a dielectric material having a second refractive index higher than the first refractive index;
    an overfill layer of the second material disposed on a top of the substrate and over the top of the trench; and
    a film of a third material encapsulating the overfill layer, the third material having a third refractive index lower than the second refractive index.

11. The flat optical structure of claim 10, wherein the first material and the third material are silicon dioxide.

12. The flat optical structure of claim 10, wherein the second material includes one of titanium dioxide, GaP, aSi, cSi, or $Si_3N_4$.

13. The flat optical structure of claim 10, wherein a height of the trench from the bottom to the top varies.

14. The flat optical structure of claim 10, further comprising a second trench in the substrate, wherein:
    the first material is exposed at a bottom of the second trench;
    the second material fills the second trench from the bottom to a top of the second trench; and
    the second trench intersects the first trench.

15. A flat optical structure, comprising:
    a substrate of a first material having a first refractive index;
    a plurality of intersecting trenches in the substrate;
    a second material including a dielectric material filling each trench, the second material having a second refractive index;
    an overfill layer of the second material disposed on a top of the substrate and over a top of each trench; and
    a film of a third material encapsulating the overfill layer, the third material having a third refractive index lower than the second refractive index.

16. The flat optical structure of claim 15, wherein:
    the first material is exposed at a bottom of each trench; and
    the second material fills each trench from the bottom to the top of each trench.

17. The flat optical structure of claim 15, wherein the second refractive index is higher than the first refractive index.

18. The flat optical structure of claim 15, wherein the second material includes one of titanium dioxide, GaP, aSi, cSi, or $Si_3N_4$.

19. The flat optical structure of claim 15, wherein the first material and the third material are silicon dioxide.

* * * * *